US012604776B2

(12) United States Patent (10) Patent No.: US 12,604,776 B2
Lin et al. (45) Date of Patent: Apr. 14, 2026

(54) LUMINOUS PANEL

(71) Applicant: AUO Corporation, Hsin-Chu (TW)

(72) Inventors: Tzu-Chun Lin, Hsin-Chu (TW);
Sheng-Yen Cheng, Hsin-Chu (TW);
Jia-Hong Wang, Hsin-Chu (TW);
Yueh-Hung Chung, Hsin-Chu (TW);
Ya-Ling Hsu, Hsin-Chu (TW);
Chen-Hsien Liao, Hsin-Chu (TW)

(73) Assignee: AUO CORPORATION, Hsin-Chu
(TW)

( * ) Notice: Subject to any disclaimer, the term of this
patent is extended or adjusted under 35
U.S.C. 154(b) by 513 days.

(21) Appl. No.: 18/146,700

(22) Filed: Dec. 27, 2022

(65) Prior Publication Data

US 2024/0047435 A1 Feb. 8, 2024

(30) Foreign Application Priority Data

Aug. 5, 2022 (TW) .................................. 111129597

(51) Int. Cl.
*H01L 29/18* (2006.01)
*H01L 33/00* (2010.01)
*H10H 20/857* (2025.01)
*H10W 46/00* (2026.01)
*H10W 90/00* (2026.01)

(52) U.S. Cl.
CPC .......... *H10W 90/00* (2026.01); *H10H 20/857*
(2025.01); *H10W 46/00* (2026.01); *H10W*
*46/301* (2026.01)

(58) Field of Classification Search
CPC ........ B81C 1/00603; B81C 3/002–007; B81C
99/007; B81C 2203/05–058; H01L
2221/68309; H01L 2224/0213; H01L
2224/0217; H01L 2224/0224; H01L
2224/10135; H01L 2224/10165; H01L
2224/26135; H01L 2224/26165; H01L
2224/40993; H01L 2224/40998; H01L
2224/48993; H01L 2224/18998; H01L
2225/06593; H01L 23/544; H01L
2223/54426
See application file for complete search history.

(56) References Cited

U.S. PATENT DOCUMENTS

| | | | | |
|---|---|---|---|---|
| 6,329,706 B1 * | 12/2001 | Nam | ................... | H10W 70/411 |
| | | | | 257/676 |
| 6,791,173 B2 * | 9/2004 | Saga | ................... | H10W 70/635 |
| | | | | 257/784 |
| 6,864,509 B2 | 3/2005 | Worley | | |
| 9,006,871 B2 * | 4/2015 | Fujisawa | ............. | H10W 70/461 |
| | | | | 257/667 |

(Continued)

*Primary Examiner* — Ismail A Muse
(74) *Attorney, Agent, or Firm* — WPAT, PC

(57) ABSTRACT

A luminous panel includes a circuit board, a plurality of
connecting pads, a chip and two alignment structures. The
connecting pads are located on the circuit board. The chip is
located on the circuit board and at least partially covers the
connecting pads. The two alignment structures are located
on the circuit board. The two alignment structures and the
connecting pads are at the same level. The two alignment
structures are located at two diagonal corners of the chip. At
least one part of the two alignment structures protrudes from
the outline of the chip.

9 Claims, 9 Drawing Sheets

100

(56) References Cited

U.S. PATENT DOCUMENTS

| | | | | |
|---|---|---|---|---|
| 2006/0103788 | A1* | 5/2006 | Kurosawa | H10W 70/093 |
| | | | | 349/110 |
| 2007/0040286 | A1 | 2/2007 | Liu et al. | |
| 2012/0223351 | A1 | 9/2012 | Margalit | |
| 2012/0280379 | A1* | 11/2012 | Arita | H10W 70/411 |
| | | | | 257/676 |
| 2012/0286311 | A1 | 11/2012 | Margalit | |
| 2014/0284780 | A1* | 9/2014 | Kinoshita | H01L 21/66 |
| | | | | 257/676 |
| 2015/0108529 | A1 | 4/2015 | Margalit | |
| 2015/0194576 | A1 | 7/2015 | Margalit | |
| 2021/0074691 | A1* | 3/2021 | Lee | H01L 23/13 |
| 2022/0166378 | A1 | 5/2022 | Kasahara et al. | |
| 2023/0187372 | A1* | 6/2023 | Hung | H01L 24/05 |
| | | | | 257/774 |

* cited by examiner

100

LUMINOUS PANEL

CROSS-REFERENCE TO RELATED APPLICATION

This application claims priority to Taiwan Application Serial Number 111129597, filed Aug. 5, 2022, which is herein incorporated by reference in its entirety.

BACKGROUND

Field of Invention

The present invention relates to a luminous panel.

Description of Related Art

With the advancement of the light emitting panel technology, the size of light-emitting diodes (LEDs) has entered the micron level. For example, the well-known mini light-emitting diode (Mini LED) refers to the size of the LED die in the range of 50 to 100 μm. At the same time, to solve the backlight bleeding problem of the luminous panel, area light control is applied to the LED panel. Specifically, the luminous panel is separated into multiple areas, and each area may be lit up individually by a circuit that contains microchips. To produce panels with higher resolution by combining the above two techniques, one needs to position all the components on the board more precisely.

SUMMARY

An aspect of the present disclosure is related to a luminous panel.

According to an embodiment of the present disclosure, a luminous panel includes a circuit board, a plurality of connecting pads, a chip, and two alignment structures. The connecting pads are located on the circuit board. The chip is located on the circuit board and covers at least a part of the connecting pads. The two alignment structures are located on the circuit board and are at the same level as the connecting pads. The two alignment structures are located at two diagonal corners of the chip. At least a part of the two alignment structures protrudes out of an outline of the chip.

In an embodiment of the present disclosure, the two alignment structures are connected to two of the connecting pads respectively.

In an embodiment of the present disclosure, the luminous panel further includes multiple wires that are at the same level as the connecting pads. The wires are connected to the connecting pads respectively.

In an embodiment of the present disclosure, a width of one of the wires is necking from the outline of the two alignment structures.

In an embodiment of the present disclosure, the two alignment structures form rectangular areas with two of the connecting pads respectively.

In an embodiment of the present disclosure, a distance between an outline of each of the two alignment structures and the outline of the chip is larger than a cutting error distance of the chip.

In an embodiment of the present disclosure, the cutting error distance is 20 μm.

In an embodiment of the present disclosure, the luminous panel further includes a solder mask. An inner edge of the solder mask surrounds the chip and the two alignment structures. Outlines of each of the two alignment structures are not covered by the solder mask, or the outlines of each of the two alignment structures are aligned to the inner edge of the solder mask.

In an embodiment of the present disclosure, the two alignment structures are separated from the connecting pads.

In an embodiment of the present disclosure, inner edges of each of the two alignment structures are not covered by the chip, or the inner edges of each of the two alignment structures are aligned to the outline of the chip.

In an embodiment of the present disclosure, the luminous panel further includes a solder mask. An inner edge of the solder mask surrounds the chip and the two alignment structures. Outlines of each of the two alignment structures are not covered by the solder mask, or the outlines of each of the two alignment structures are aligned to the inner edge of the solder mask.

In an embodiment of the present disclosure, the two alignment structures are electrically connected to two of the connecting pads respectively.

In an embodiment of the present disclosure, the two alignment structures and the connecting pads are the same material.

According to an embodiment of the present disclosure, a luminous panel includes a circuit board, connecting pads, two alignment structures, and a solder mask. The connecting pads are located on the circuit board. The two alignment structures are located on the circuit board and at the same level as the connecting pads. The inner edge of the solder mask surrounds the two alignment structures. Outlines of each of the two alignment structures are not covered by the solder mask, or the outlines of each of the two alignment structures are aligned with the inner edge of the solder mask.

In an embodiment of the present disclosure, the two alignment structures are connected to two of the connecting pads respectively.

In the aforementioned embodiments of the present disclosure, in the luminous panel of the present disclosure, by combining the connecting pads and the alignment structures that are on the same level with the connecting pads, further improve the alignment currency of the wafer on the circuit board. The connecting pads and the alignment structures may be combined and form rectangular areas, in this way, the shape of the alignment structures can be simplified under the manufacturing process, and the alignment structures mark positions on the circuit board for the alignment of the chip. When the alignment structures are separated with the connecting pads, the position of the chip may be marked more precisely through the inner edge of the alignment structures. Moreover, the separated alignment structures and the connecting pads may be connected to each other by connecting structures, in this way, the alignment structures may provide additional electrical test points, and thus reduce the loss of the connecting pads during testing.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
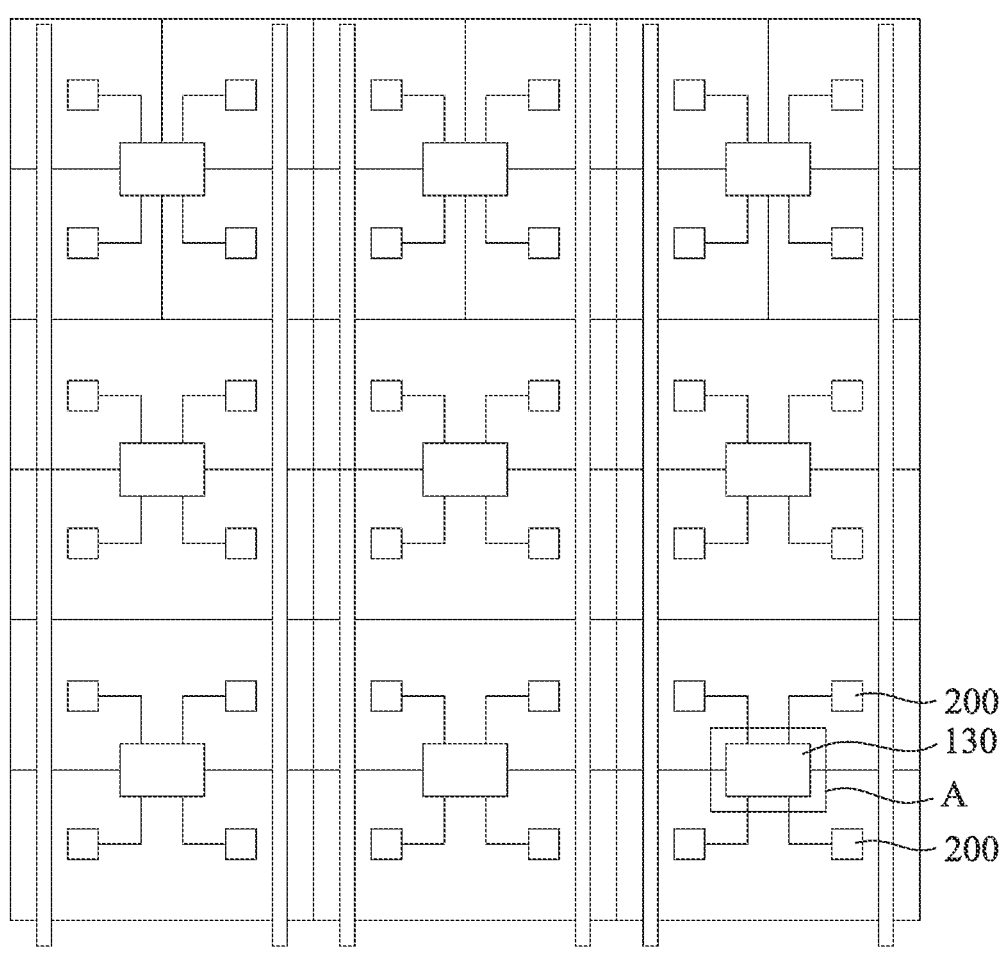
FIG. 1 schematically illustrates luminous panel, according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2A:
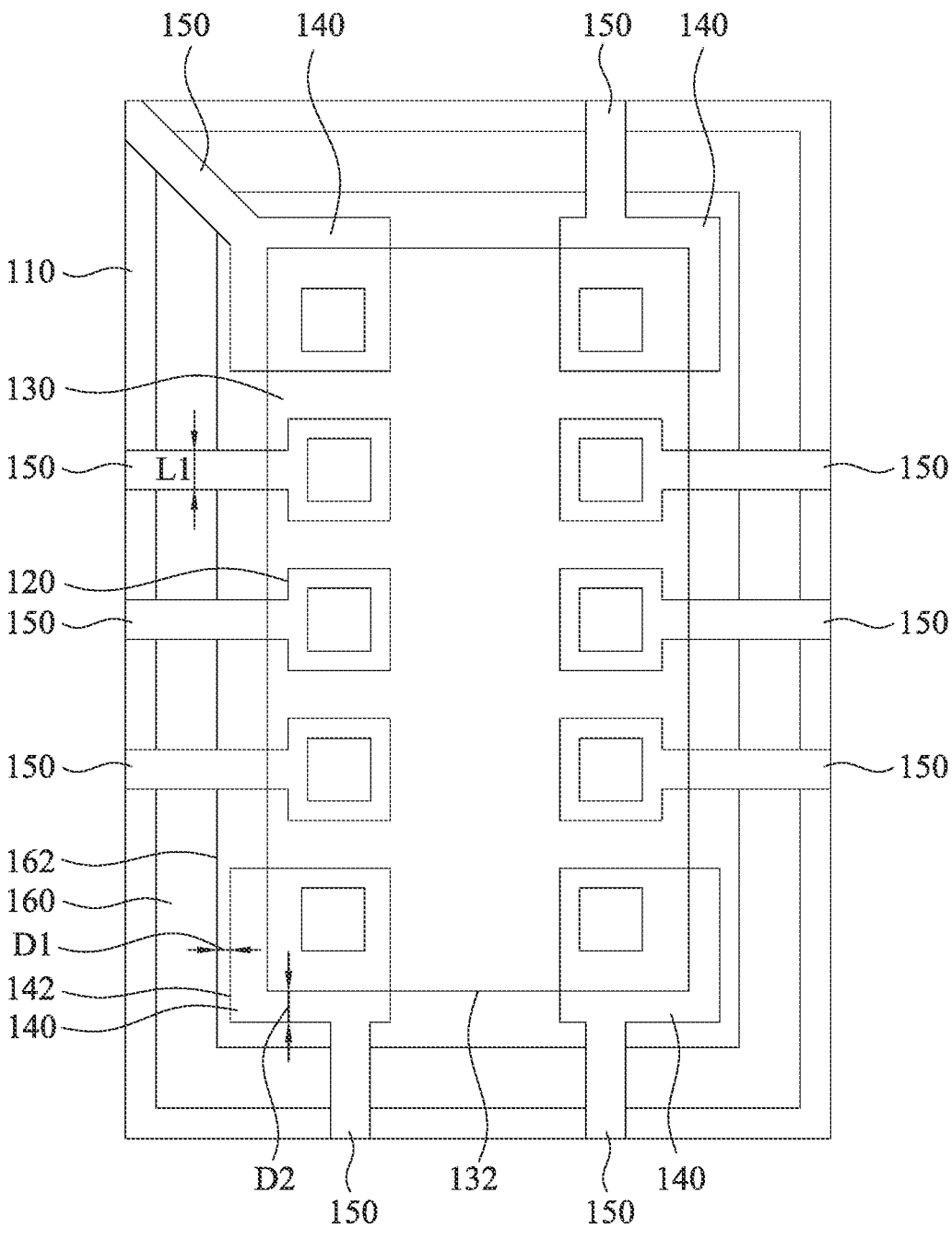
FIG. 2A schematically illustrates an enlarged perspective view of a part of a luminous panel, according to some embodiments of the present disclosure.

FIG. 1 schematically illustrates luminous panel 100, according to one embodiment of the present disclosure. FIG. 2A schematically illustrates an enlarged perspective view of a part of a luminous panel 200, according to some embodiments of the present disclosure. Specifically, FIG. 2A is an enlarged perspective view of area A marked in FIG. 1. In addition, the forgoing FIGS. 2B, 2C, 3, 4A, 4B, 4C, and 5 are also enlarged perspective views of area A marked in FIG. 1 in different embodiments. References are made to FIGS. 1 and 2A, a luminous panel 100 includes a circuit board 110, a plurality of connecting pads 120, a chip 130, and two alignment structures 140. The connecting pads 120 are located on the circuit board 110. The chip 130 is located on the circuit board 110 and covered at least a part of the connecting pads 120. The two alignment structures 140 are located on the circuit board 110 and are at the same level as the connecting pads 120. The two alignment structures 140 are located at two diagonal corners of the chip 130. At least a part of the two alignment structures 140 protrudes out of an outline 132 of the chip 130.

The luminous panel 100 shown in FIG. 1 is a schematic diagram in a top view. In this embodiment, luminous panel 100 adopts area light control. Area light control separates the circuit board 110 into multiple light-emitting areas and lights up individual areas to control the display of the luminous panel 100. Specifically, one may control light-emitting areas of the circuit board 110 individually by setting chips 130 in each light-emitting area. One chip 130 may be connected to multiple light-emitting diodes, for example, mini light-emitting diodes (Mini LEDs) or micro light-emitting diodes (Micro LEDs), at the same time.

The surrounding area near the chip 130 is being enlarged in FIG. 2A. In particular, in FIG. 2A, the structures inside outline 132 of chip 130 are located on the circuit board 110 underlying chip 130 and are covered by chip 130. To clearly show the structures underlying chip 130, the structures such as connecting pads 120, and contacts of chip 130 are also shown in FIG. 2A. In other words, chip 130 in FIG. 2A is drawn in a perspective view. In the following FIGS. 2B, 2C, 3, 4A, 4B, 4C, and 5, the embodiments are drawn in the same way as FIG. 2A. In the embodiment shown in FIG. 2A, chip 130 has ten contacts; however, the present disclosure is not limited to this. In other embodiments, the number of contacts of chip 130 is dependent on the chip type, and the number of connecting pads 120 that are located on the circuit board 110 corresponds to the number of contacts.

Reference is made to FIG. 2A, in some embodiments, at least two alignment structures 140 are connected to two of the connecting pads 120 respectively. The connecting pads 120 are not connected with each other and have a suitable distance between them to avoid electrical shortcuts. Moreover, in some embodiments, the distance between two of the connecting pads 120 at least larger than 70 μm. Specifically, there exist two sets of alignment structures 140 in FIG. 2A. The sets of alignment structures 140 are located on two different diagonal lines of chip 130. The four alignment structures 140 are connected to connecting pads 120 that are located adjacent to the four corners of chip 130 respectively. Furthermore, in this example, each alignment structure 140 forms a rectangle area with each connecting pad 120 respectively, but the present disclosure is not limited to this. In other embodiments, each alignment structure 140 may form any other shape with each connecting pad 120.

Reference is made to FIG. 2A, since alignment structures 140 and connecting pads 120 are at the same level, therefore, in some embodiments, both of them may be formed on the circuit board 110 in the same process. Generally, materials for forming the connecting pads 120 may include, for example, metal materials, indium tin oxide (ITO), or other conductive materials. Chip 130 may be electrically connected to the circuit board 110 by connecting to the connecting pads 120. In some embodiments, alignment structures 140 and connecting pads 120 are the same material. In addition, in some embodiments, alignment structures 140 and connecting pads 120 are electrically connected. Alignment structures 140 and connecting pads 120 formed with the same material may simplify the manufacturing process but also make alignment structures 140 conductive. Conductive alignment structures 140 electrically connected to connecting pads 120 may provide additional electrical test points, and thus reduce the loss of the connecting pads during testing. Moreover, in some embodiments where the alignment structures 140 and the connecting pads 120 are connected together (e.g., in FIGS. 2A, 2B, 2C, and 3, the alignment structures 140 and the connecting pads 120 form rectangle shapes respectively,) the pattern complexity of the alignment structures 140 may be reduced, in order to facilitate the formation of the alignment structures 140.

Reference is made to FIG. 2A, in some embodiments, a distance D2 between outline 142 of each alignment structure 140 and outline 132 of chip 130 is larger than a cutting error distance of chip 130. Specifically, the cutting error distance of chip 130 may affect the size of chip 130. When distance D2 is larger than the cutting error distance, the contacts of chip 130 may cover at least a part of each connecting pad 120, which improves the stability of the electrical connection between chip 130 and circuit board 110. Generally, the cutting error distance depends on the cutting accuracy of the apparatus. For example, the cutting error distance may be 20 μm, however, other suitable values may be utilized.

Reference is made to FIG. 2A. In some embodiments, luminous panel 100 further includes multiple wires 150.

Wires 150 are at the same level as connecting pads 120. Wires 150 are connecting to connecting pads 120 respectively. In the embodiment, shown in FIG. 2A, each connecting pad 120 is connected to a corresponding wire 150. However, the present disclosure is not limited to this. The connection of wires 150 depends on the circuit design of chip 130. In this example, four alignment structures 140 are connected to connecting pads 120 at four corners of chip 130 respectively. Each alignment structure 140 forms a rectangle area with each connecting pad 120, thus wire 150 may connect to connecting pad 120 by connecting with alignment structure 140. In addition, wires 150, connecting pads 120, and alignment structures 140 are formed by the same material (e.g., conductive material.) Therefore, wires 150 may form in the same manufacturing process with connecting pads 120 and alignment structures 140, but also achieve the purpose of connecting to connecting pads 120 by connecting with alignment structures 140. Moreover, in the embodiment shown in FIG. 2A, connecting pads 120 that are not adjacent to the corners of chip 130 may be directly connected to wires 150.

Reference is made to FIG. 2A, in some embodiments, a width L1 of one of the wires 150 is necking from the outline of alignment structures 140. In the example shown in FIG. 2A, when wires 150 connect to the rest of connecting pads 120 that are not connected to the alignment structures 140, the width L1 of the wires 150 may be necking from the outline of connecting pads 120.

Figure 2B:
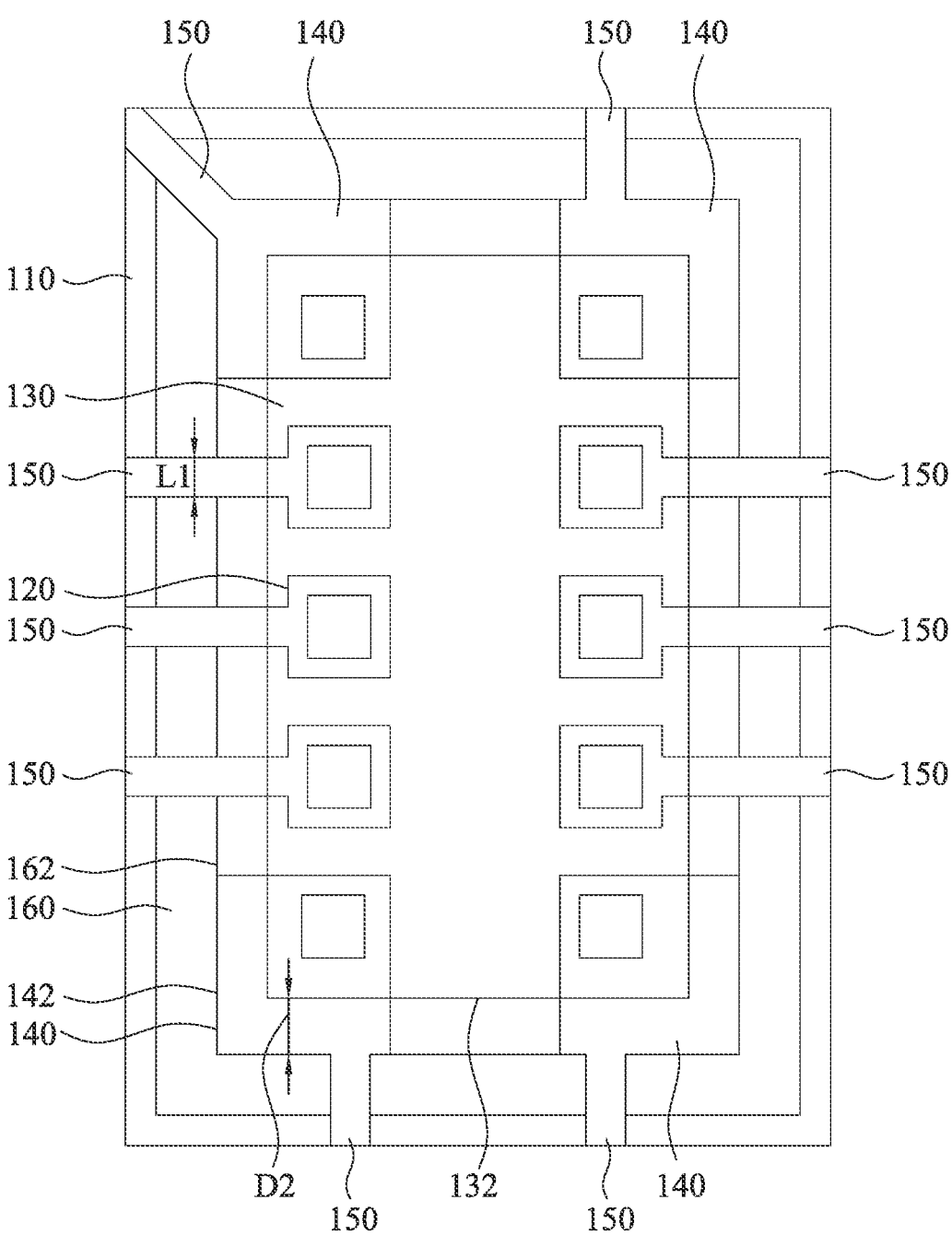
FIG. 2B schematically illustrates an enlarged perspective view of a part of a luminous panel, according to some other embodiments of the present disclosure.

FIG. 2B schematically illustrates an enlarged perspective view of a part of a luminous panel 100, according to some other embodiments of the present disclosure. References are made to FIG. 2A and FIG. 2B, in some embodiments, the luminous panel 100 further includes a solder mask 160. An inner edge 162 of the solder mask 160 surrounds chip 130 and alignment structures 140. Outlines 142 of each of the alignment structures 140 are not covered by the solder mask 160 (as shown in FIG. 2A), or the outlines 142 of each of the alignment structures 140 are aligned to the inner edge 162 of the solder mask 160 (as shown in FIG. 2B.) In the embodiment shown in FIG. 2A, solder mask 160 is frame-like, and chip 130 is surrounded by solder mask 160. Distance D1 is between the inner edge 162 of solder mask 160 and the outline 142 of alignment structure 140. When distance D1 is larger than or equal to 0 indicates that the outline 142 of alignment structure 140 is located inside the inner edge 162 of solder mask 160 (e.g., the example shown in FIG. 2A,) and the alignment structure 140 and chip 130 are surrounded by solder mask 160. Alternatively, the outline 142 of alignment structure 140 may align to the inner edge 162 of solder mask 160 (e.g., the example shown in FIG. 2B.)

Figure 2C:
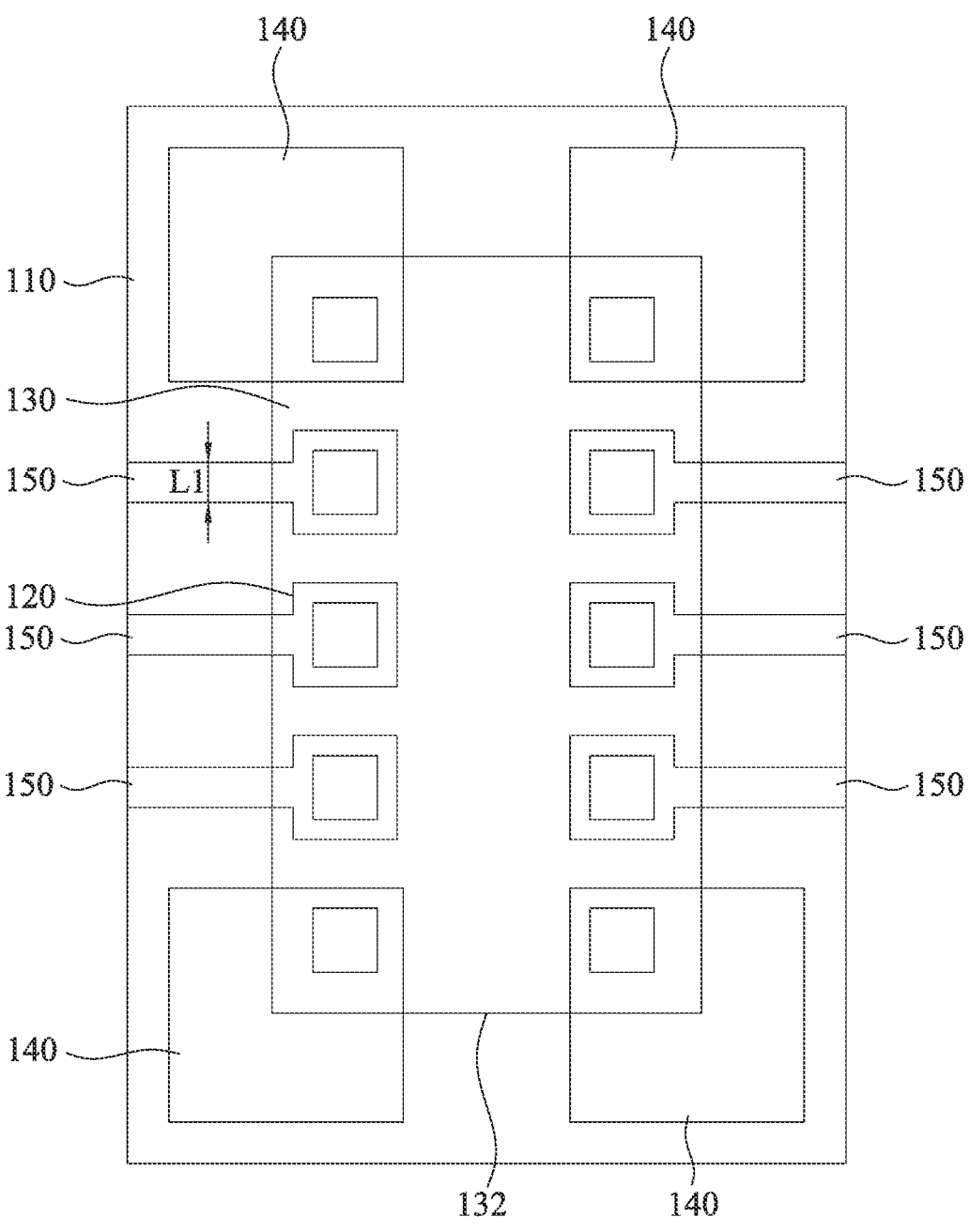
FIG. 2C schematically illustrates an enlarged perspective view of a part of a luminous panel, according to some other embodiments of the present disclosure.

FIG. 2C schematically illustrates an enlarged perspective view of a part of a luminous panel 100, according to some other embodiments of the present disclosure. References are made to FIG. 1 and FIG. 2C, the embodiment here does not include the discussed solder mask 160. Therefore, outline 142 of alignment structure 140 of luminous panel 100 will not be limited by distance D1 (shown in FIG. 2A.) Instead, outline 142 of alignment structure 140 will be limited by the area covered by the LED that is controlled by chip 130. The luminous panel in FIG. 1 adapts area light control. Hence, multiple independent light-emitting areas are controlled by different chips 130. The maximum distance of the outline 142 of alignment structure 140 may extend to the edge of the area controlled by chip 130, however, other distances smaller than this may be utilized. In this way, alignment structures 140 may be enlarged to improve their resolution.

Figure 3:
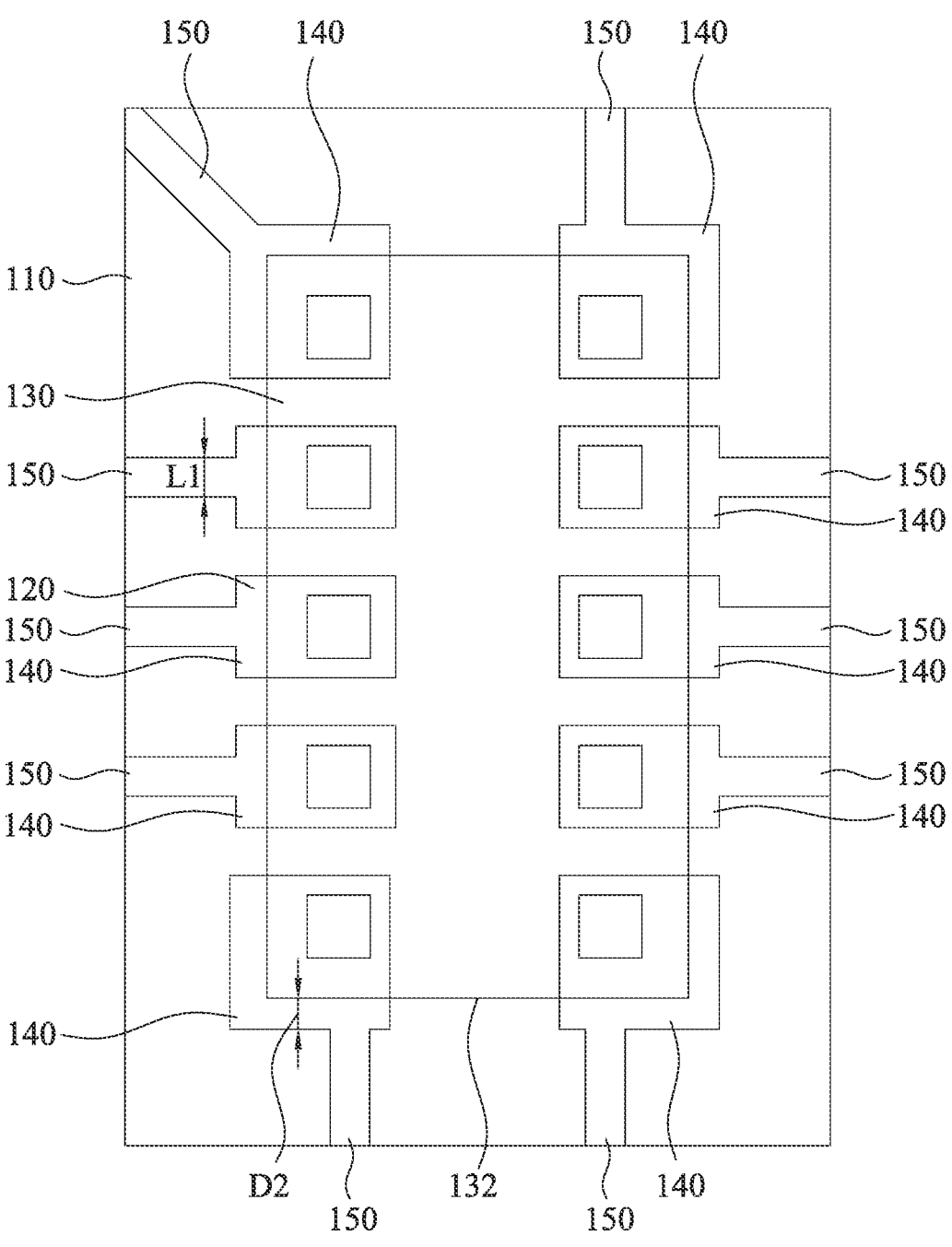
FIG. 3 schematically illustrates an enlarged perspective view of a part of a luminous panel, according to some other embodiments of the present disclosure.

FIG. 3 schematically illustrates an enlarged perspective view of a part of a luminous panel 100, according to some other embodiments of the present disclosure. Reference is made to FIG. 3, similar to FIG. 2A, in this embodiment exists two sets of alignment structures 140, and they are located on two different diagonal lines of chip 130. However, in the embodiment shown in FIG. 3, the rest of the connecting pads 120 that are not located at the corners of chip 130 also form multiple rectangular areas with alignment structures 140. As a result, the example may provide more alignment structures 140 to chip 130, and assist chip 130 to install on circuit board 110.

Figure 4A:
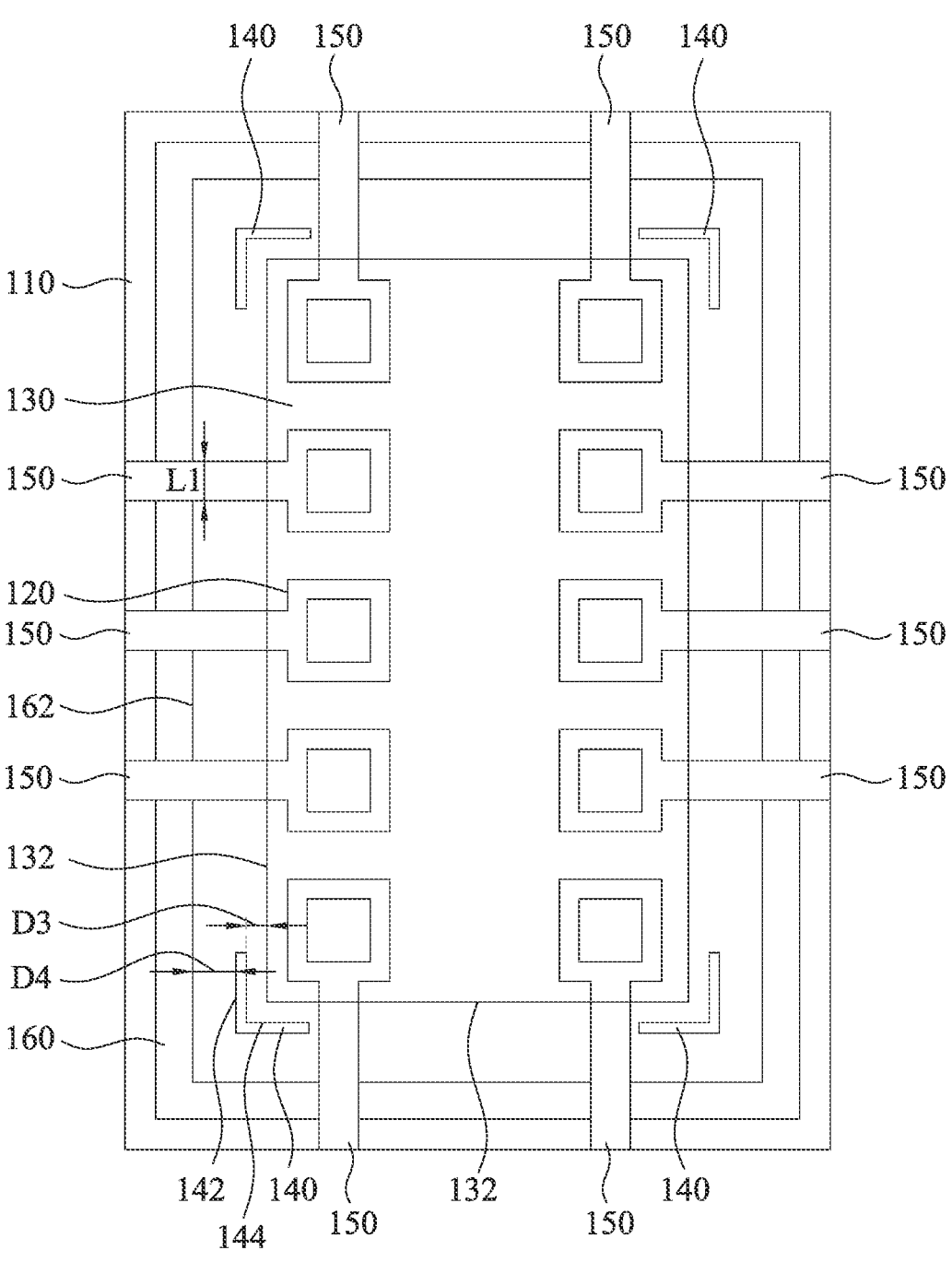
FIG. 4A schematically illustrates an enlarged perspective view of a part of a luminous panel, according to some other embodiments of the present disclosure.
Figure 4B:
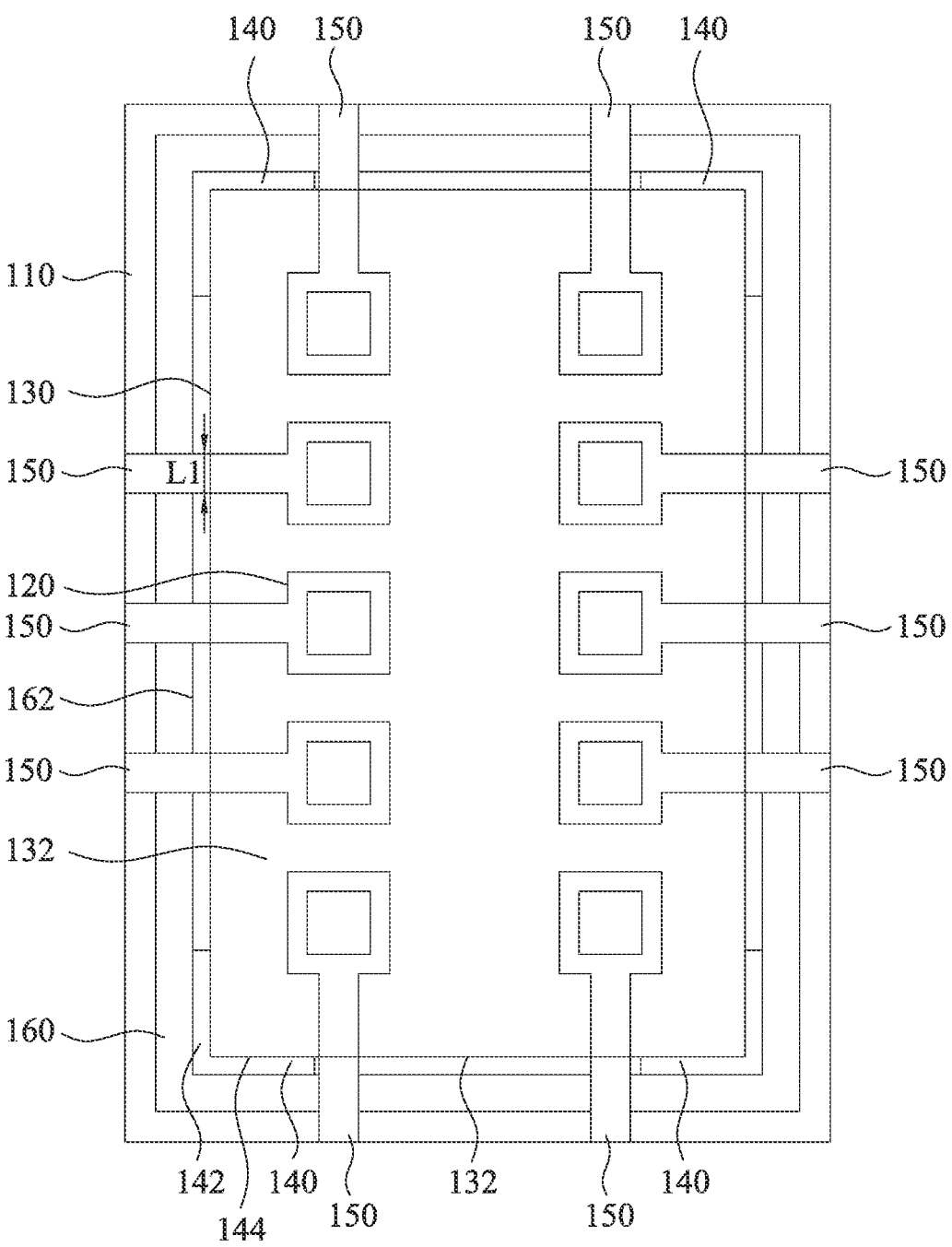
FIG. 4B schematically illustrates an enlarged perspective view of a part of a luminous panel, according to some other embodiments of the present disclosure.

FIG. 4A schematically illustrates an enlarged perspective view of a part of a luminous panel 100, according to some other embodiments of the present disclosure. FIG. 4B schematically illustrates an enlarged perspective view of a part of a luminous panel 100, according to some other embodiments of the present disclosure. References are made to FIG. 4A and FIG. 4B, in some embodiments, alignment structures 140 are separated from connecting pads 120. Specifically, the embodiment shown in FIG. 4A has two sets of alignment structures 140. The two sets of alignment structures 140 are located on two different diagonal lines of chip 130. Four alignment structures 140 are all separated from connecting pads 120. In the example shown in FIG. 4A, alignment structure 140 has an L-shape. However, other suitable shape may be utilized. More specifically, in some embodiments, the inner edge 144 of each alignment structure 140 is not covered by chip 130 (e.g., as the example shown in FIG. 4A,) or the inner edge 144 of each alignment structure 140 aligns to the outline 132 of chip 130 (e.g., as the example shown in FIG. 4B.) Distance D3 indicates the distance between alignment structure 140 and chip 130. By controlling distance D3, one may control a tolerable error value range during the alignment, and thus prevent alignment structure 140 covered by chip 130. For example, the minimum value of distance D3 will align the inner edge of alignment structure 140 and the outline of chip 130. In this way, chip 130 may be aligned more precisely through the marker. In some embodiments, luminous panel 100 further includes a solder mask 160. An inner edge 162 of solder mask 160 surrounds chip 130 and alignment structures 140. Outlines 142 of each of the alignment structures 140 are not covered by solder mask 160 (e.g., as shown in FIG. 4A,) or the outlines 142 of each of the alignment structures 140 are aligned to the inner edge 162 of solder mask 160 (e.g., as shown in FIG. 4B). In the embodiment shown in FIG. 4A and FIG. 4B, solder mask 160 is frame-like. Distance D4 indicates the distance between the alignment structure 140 and solder mask 160. When distance D4 equals 0, it indicates that outline 142 of alignment structure 140 is aligned to the inner edge 162 of solder mask 160 (e.g., the example shown in FIG. 4B.) Therefore, the space between chip 130 and solder mask 160 may be used to form alignment structures 140, and also prevent chip 130 or solder mask 160 to cover alignment structures 140.

Figure 4C:
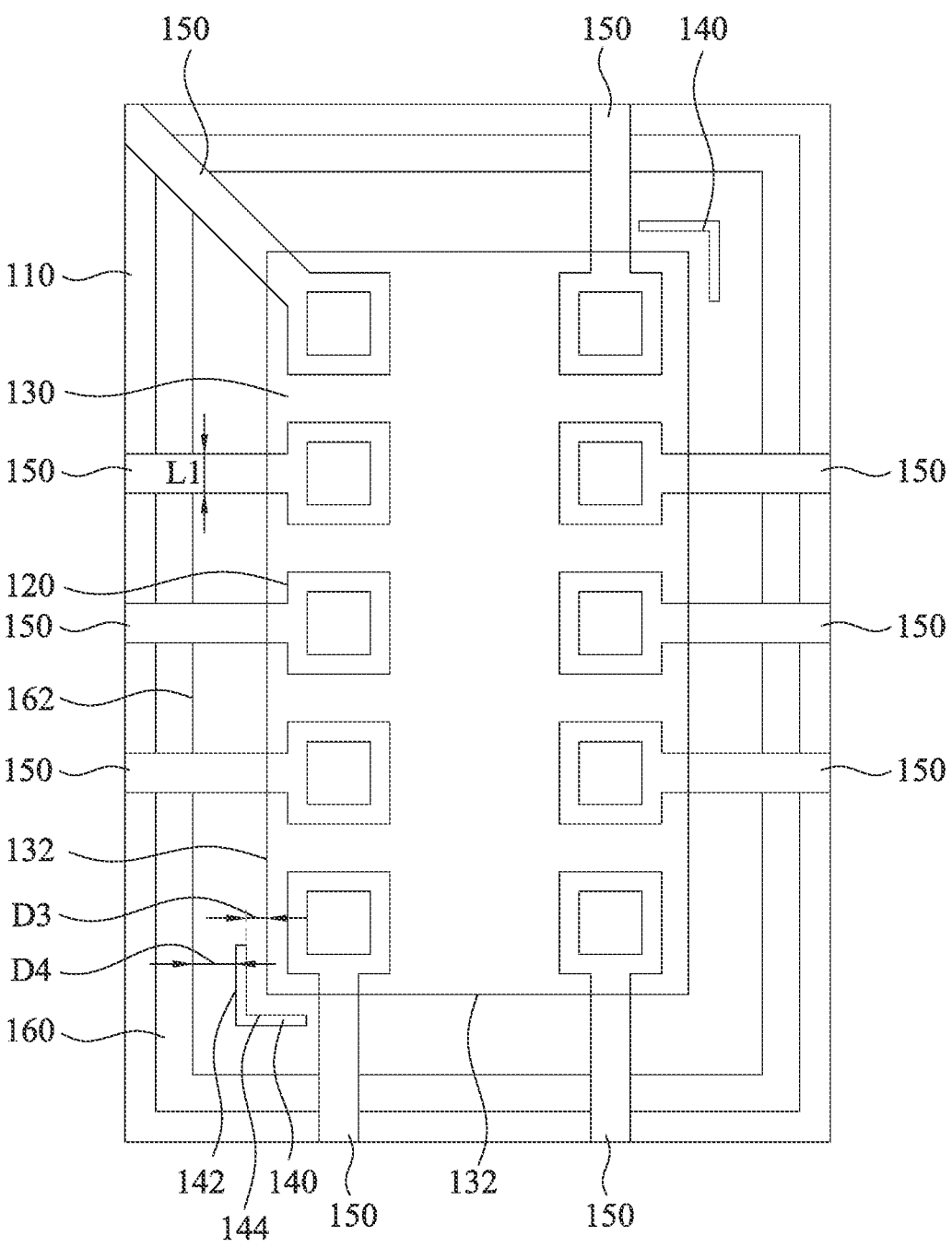
FIG. 4C schematically illustrates an enlarged perspective view of a part of a luminous panel, according to some other embodiments of the present disclosure.

FIG. 4C schematically illustrates an enlarged perspective view of a part of a luminous panel 100, according to some other embodiments of the present disclosure. Reference is made to FIG. 4C. The embodiment here is similar to the embodiment shown in FIG. 4A. However, only one set of alignment structures 140 is located on one of the diagonal lines of chip 130. In this example, the inner edge 144 of alignment structure 140 and the outline 132 of chip 130 have a distance D3, and the outline 142 of alignment structure 140 and the inner edge 162 of solder mask 160 have a distance D4. The range of distance D3 and distance D4 may be similar or the same as the embodiment shown in FIG. 4A.

Figure 5:
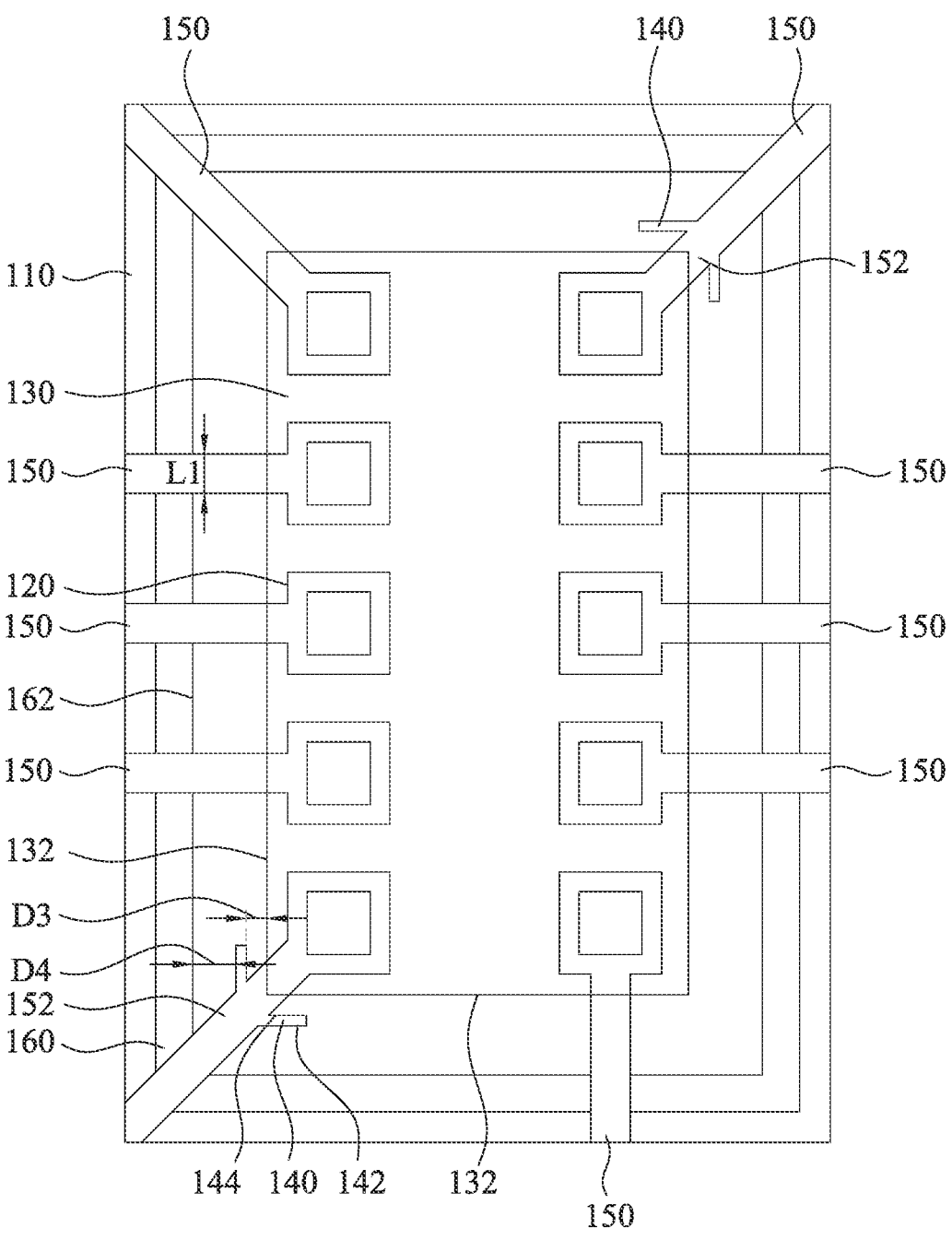
FIG. 5 schematically illustrates an enlarged perspective view of a part of a luminous panel, according to some other embodiments of the present disclosure.

FIG. 5 schematically illustrates an enlarged perspective view of a part of a luminous panel 100, according to some other embodiments of the present disclosure. Reference is made to FIG. 5. The embodiment here is similar to the embodiment shown in FIG. 4C. However, alignment structures 140 located on one of the diagonal lines of chip 130 are electrically connected to connecting pads 120 respectively. Specifically, the electrical connection between alignment strictures 140 and connecting pads 120 is achieved by forming connecting patterns 152 between alignment strictures 140 and connecting pads 120. In FIG. 5, connecting pattern 152 is a straight line, and the two ends of the straight line are in contact with alignment strictures 140 and connecting pads 120 respectively. Forming electrical connections between alignment strictures 140 and connecting pads 120 may balance the voltage difference between the alignment strictures 140 and connecting pads 120, and further prevent alignment structures 140 from generating floating electrical potential. If floating electrical potential has been generated on the alignment strictures 140, it may affect its adjacent connecting pads 120, and reduce the performance of chip 130. Therefore, one has to balance the voltage difference between the alignment strictures 140 and connecting pads 120 by connecting them through connecting pattern 152. In some embodiments, connecting pattern 152 also is a wire 150 that connects to connecting pad 120, and the width L1 of wire 150 is necking from the outline of connecting pad 120. On the other hand, the alignment strictures 140 that connect to the connecting pads 120 may provide additional electrical test points and thus reduce the loss of the connecting pads during testing.

In the aforementioned embodiments of the present disclosure, in the luminous panel of the present disclosure, by combining the connecting pads and the alignment structures that are on the same level with the connecting pads, further improve the alignment currency of the wafer on the circuit board. The connecting pads and the alignment structures may be combined and form rectangular areas, in this way, the shape of the alignment structures can be simplified under the manufacturing process, and the alignment structures mark positions on the circuit board for the alignment of the chip. When the alignment structures are separated with the connecting pads, the position of the chip may be marked more precisely through the inner edge of the alignment structures. Moreover, the separated alignment structures and the connecting pads may connected to each other by connecting structures, in this way, the alignment structures may provide additional electrical test point, and thus reduce the loss of the connecting pads during testing.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A luminous panel, comprising:
a circuit board;
a plurality of connecting pads disposed on the circuit board;
a chip disposed on the circuit board and covering at least a part of the plurality of connecting pads;
two alignment structures disposed on the circuit board and at the same level as the plurality of connecting pads, the two alignment structures being located at two diagonal corners of the chip, wherein each of the two alignment structures has an L-shape, an entirety of each of the two alignment structures is out of an outline of the chip, and there is a nonzero distance between an inner edge of each of the two alignment structures and the outline of the chip; and
a plurality of wires extending to an edge of the circuit board and connected to the connecting pads, respectively, that are non-overlapping and spaced apart from the two alignment structures.

2. The luminous panel of claim 1, wherein the plurality of wires are at the same level as the plurality of connecting pads.

3. The luminous panel of claim 2, wherein a width of one of the wires is necking from an outline of the two alignment structures.

4. The luminous panel of claim 1, further comprising a solder mask, wherein an inner edge of the solder mask surrounds the outline of the chip and the two alignment structures, and outlines of each of the two alignment structures are not covered by the solder mask, or the outlines of each of the two alignment structures are aligned with the inner edge of the solder mask.

5. The luminous panel of claim 1, wherein the two alignment structures are separated from the plurality of connecting pads.

6. The luminous panel of claim 5, wherein the two alignment structures are electrically connected to two of the plurality of connecting pads respectively.

7. The luminous panel of claim 1, wherein the two alignment structures and the plurality of connecting pads are made of the same material.

8. A luminous panel, comprising:
a circuit board;
a plurality of connecting pads disposed on the circuit board;
a chip covering at least a part of the plurality of connecting pads;
two alignment structures disposed on the circuit board and at the same level as the plurality of connecting pads; and
a solder mask, wherein an inner edge of the solder mask surrounds an outline of the chip and the two alignment structures, outlines of each of the two alignment structures are not covered by the solder mask, or the outlines of each of the two alignment structures are aligned with the inner edge of the solder mask,
wherein at least a part of each of the two alignment structures lies between the outline of the chip and the inner edge of the solder mask, and there is a non-zero distance between the inner edge of the solder mask and the two alignment structures.

9. The luminous panel of claim 8, wherein the two alignment structures are between the outline of the chip and the inner edge of the solder mask.

* * * * *